US011508792B2

(12) United States Patent
Okabe et al.

(10) Patent No.: US 11,508,792 B2
(45) Date of Patent: Nov. 22, 2022

(54) DISPLAY DEVICE AND METHOD FOR MANUFACTURING DISPLAY DEVICE

(71) Applicant: SHARP KABUSHIKI KAISHA, Sakai (JP)

(72) Inventors: Tohru Okabe, Sakai (JP); Ryosuke Gunji, Sakai (JP); Shinji Ichikawa, Sakai (JP); Kohji Ariga, Aioi (JP); Shinsuke Saida, Sakai (JP); Hiroki Taniyama, Sakai (JP); Hiroharu Jinmura, Yonago (JP); Yoshihiro Nakada, Yonago (JP); Koji Tanimura, Yonago (JP); Yoshihiro Kohara, Yonago (JP); Akira Inoue, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 102 days.

(21) Appl. No.: 17/042,883

(22) PCT Filed: Mar. 28, 2018

(86) PCT No.: PCT/JP2018/012939
§ 371 (c)(1),
(2) Date: Sep. 28, 2020

(87) PCT Pub. No.: WO2019/186819
PCT Pub. Date: Oct. 3, 2019

(65) Prior Publication Data
US 2021/0050395 A1  Feb. 18, 2021

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 27/3258* (2013.01); *H01L 27/3279* (2013.01);
(Continued)

(58) Field of Classification Search
CPC ............. H01L 27/3246; H01L 27/3258; H01L 27/3279; H01L 51/0097; H01L 51/56; H01L 2227/323; H01L 2251/5338
(Continued)

(56) References Cited

U.S. PATENT DOCUMENTS

2014/0353670 A1    12/2014  Youn et al.
2015/0179724 A1*    6/2015  Lee ..................... H01L 27/3272
                                                                    438/23
(Continued)

FOREIGN PATENT DOCUMENTS

JP    2014-232300 A    12/2014
JP    2017-116904 A     6/2017
(Continued)

OTHER PUBLICATIONS

English Machine Translation of Japanese Patent Publication JP 2017/116904. (Year: 2017).*

*Primary Examiner* — Dzung Tran
(74) *Attorney, Agent, or Firm* — ScienBiziP, P.C.

(57) ABSTRACT

In a display region, etching stopper layers are provided between a plurality of inorganic insulating films, openings are formed in the inorganic insulating films located closer to a light-emitting element than the etching stopper layers so as to expose the upper surfaces of the etching stopper layers, and flattening films are provided in the openings such that the openings are filed with the flattening films.

8 Claims, 14 Drawing Sheets

(52) U.S. Cl.
CPC .......... *H01L 51/0097* (2013.01); *H01L 51/56* (2013.01); *H01L 2227/323* (2013.01); *H01L 2251/5338* (2013.01)

(58) Field of Classification Search
USPC .......................................................... 257/40
See application file for complete search history.

(56) References Cited

U.S. PATENT DOCUMENTS

| | | | |
|---|---|---|---|
| 2015/0371573 A1* | 12/2015 | Choi | .................... G09G 3/3225 345/206 |
| 2016/0233251 A1* | 8/2016 | Sasaki | ............... H01L 29/78609 |
| 2016/0306460 A1* | 10/2016 | Lee | ....................... H01L 27/322 |
| 2017/0069873 A1* | 3/2017 | Kim | .................... H01L 51/5253 |
| 2017/0179210 A1 | 6/2017 | Kimura et al. | |
| 2017/0194404 A1 | 7/2017 | Park et al. | |
| 2018/0076221 A1 | 3/2018 | Hanari | |
| 2018/0204896 A1 | 7/2018 | Park et al. | |

FOREIGN PATENT DOCUMENTS

| | | | |
|---|---|---|---|
| JP | 2017-120775 A | 7/2017 | |
| JP | 2018-044985 A | 3/2018 | |

* cited by examiner

DISPLAY DEVICE AND METHOD FOR MANUFACTURING DISPLAY DEVICE

TECHNICAL FIELD

The disclosure relates to a display device and a method for manufacturing the display device.

BACKGROUND ART

In recent years, a self-luminous organic EL display device using an organic EL (electroluminescence) element has been attracting attention as a display device replacing a liquid crystal display device. As this type of organic EL display device, a flexible organic EL display device is proposed in which an organic EL element or the like is formed on a resin substrate having flexibility.

For example, PTL 1 discloses a flexible organic light-emitting diode display device in which a plurality of trenches that extend through a first buffer layer covering a first wiring line, a second buffer layer covering a second wiring line, and an intermediate insulating film covering a gate element are disposed at a bending region of a non-display region.

CITATION LIST

Patent Literature

PTL 1: JP 2017-120775 A

SUMMARY

Technical Problem

Incidentally, in the organic light-emitting diode display device disclosed in PTL 1, although the elements can be restrained from being damaged by dispersing the deflection stress in the bending region disposed in the non-display region that surrounds the display region, since no consideration is taken in relation to bending in the display region, there are fears that the light-emitting element is damaged.

The disclosure has been made in view of the problem described above, and an object thereof is to suppress the damage to the light-emitting element that would be caused by bending in the display region.

Solution to Problem

To achieve the object described above, a display device according to the disclosure includes: a resin substrate; a TFT layer provided on the resin substrate; and a light-emitting element provided on the TFT layer and constituting a display region. The TFT layer includes: a plurality of inorganic insulating films provided on the resin substrate; a plurality of semiconductor layers provided between inorganic insulating films of the plurality of inorganic insulating films, each of the plurality of semiconductor layers constituting a TFT; a plurality of first wiring lines provided between inorganic insulating films of the plurality of inorganic insulating films and extending parallel to each other in the display region; a plurality of second wiring lines provided between inorganic insulating films of the plurality of inorganic insulating films located closer to the light-emitting element than the plurality of first wiring lines and extending parallel to each other in a direction intersecting the plurality of first wiring lines in the display region; and a flattening film provided closer to the light-emitting element than the plurality of second wiring lines. In the display region, an etching stopper layer is provided between inorganic insulating films of the plurality of inorganic insulating films. An opening is formed in inorganic insulating films located closer to the light-emitting element than the etching stopper layer, the opening extending through the inorganic insulating films and exposing an upper surface of the etching stopper layer. The flattening film is provided in the opening such that the opening is filled with the flattening film.

Advantageous Effects of Disclosure

According to the disclosure, in a display region, the etching stopper layer is provided between inorganic insulating films constituting the TFT layer, the opening is formed in the inorganic insulating films located closer to the light-emitting element than the etching stopper layer, and the flattening film is provided such that the opening is filled with the flattening film. Accordingly, damage to the light-emitting element due to bending in the display region can be suppressed.

DESCRIPTION OF EMBODIMENTS

Hereinafter, embodiments of the disclosure will be described in detail with reference to the drawings. Additionally, the disclosure is not limited to the embodiments described below.

First Embodiment

Figure 1:
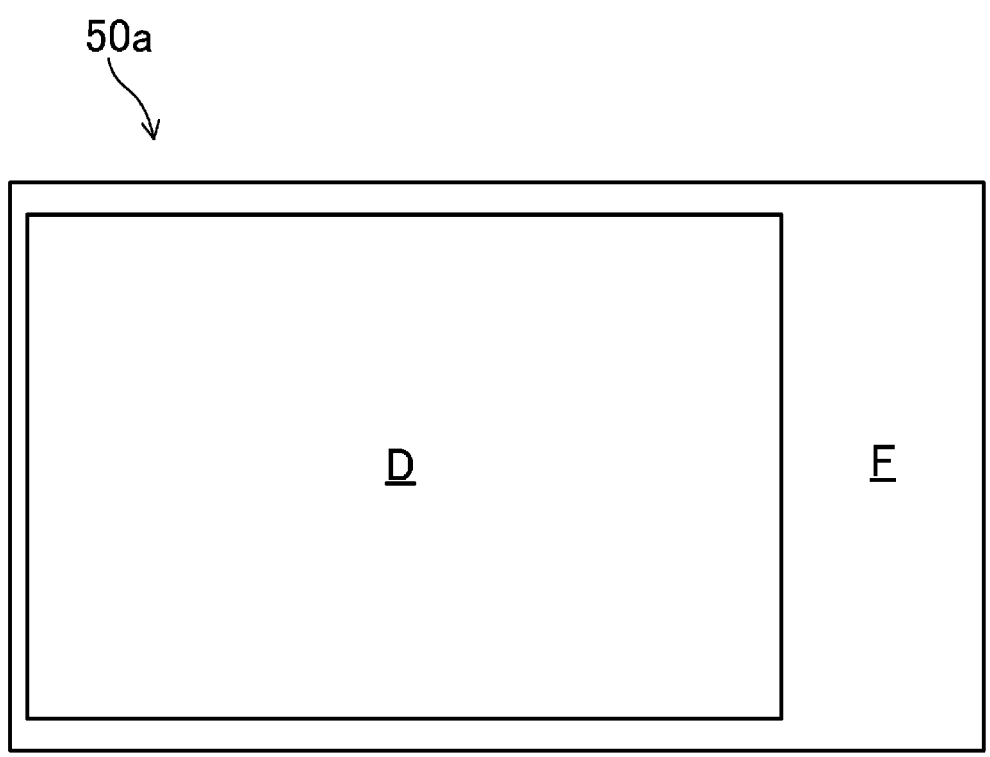
FIG. 1 is a plan view illustrating a schematic configuration of an organic EL display device according to a first embodiment of the disclosure.
Figure 2:
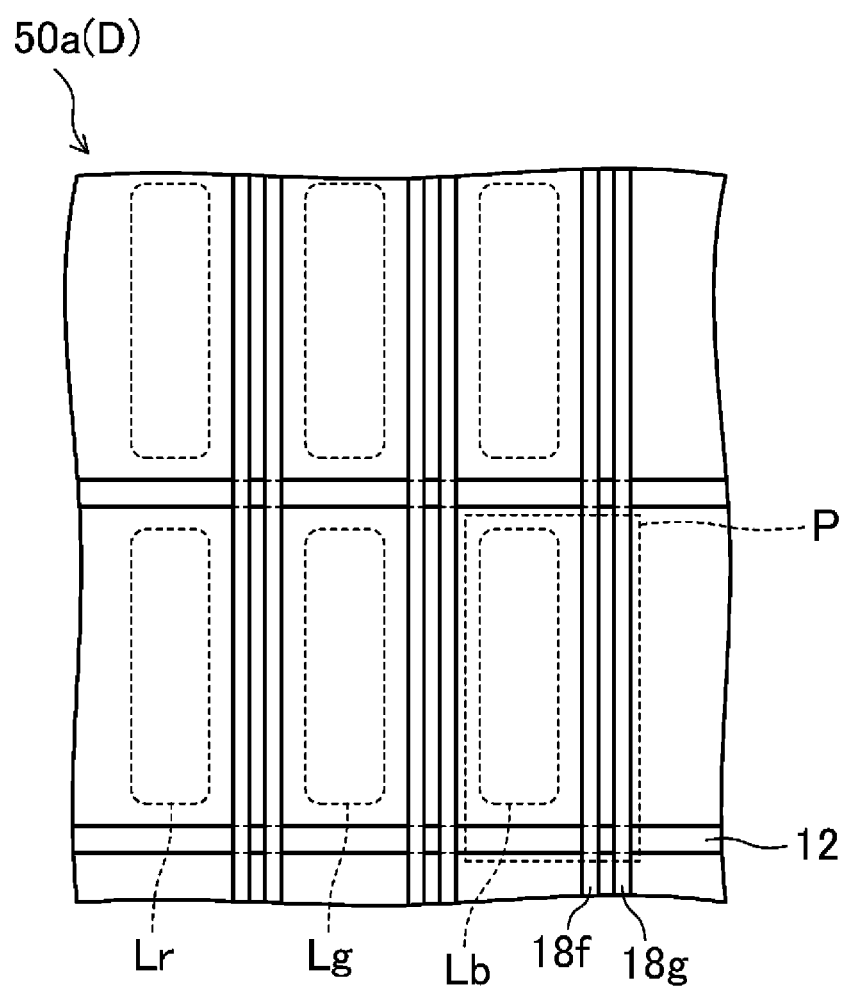
FIG. 2 is a plan view of a display region of the organic EL display device according to the first embodiment of the disclosure.
Figure 3:
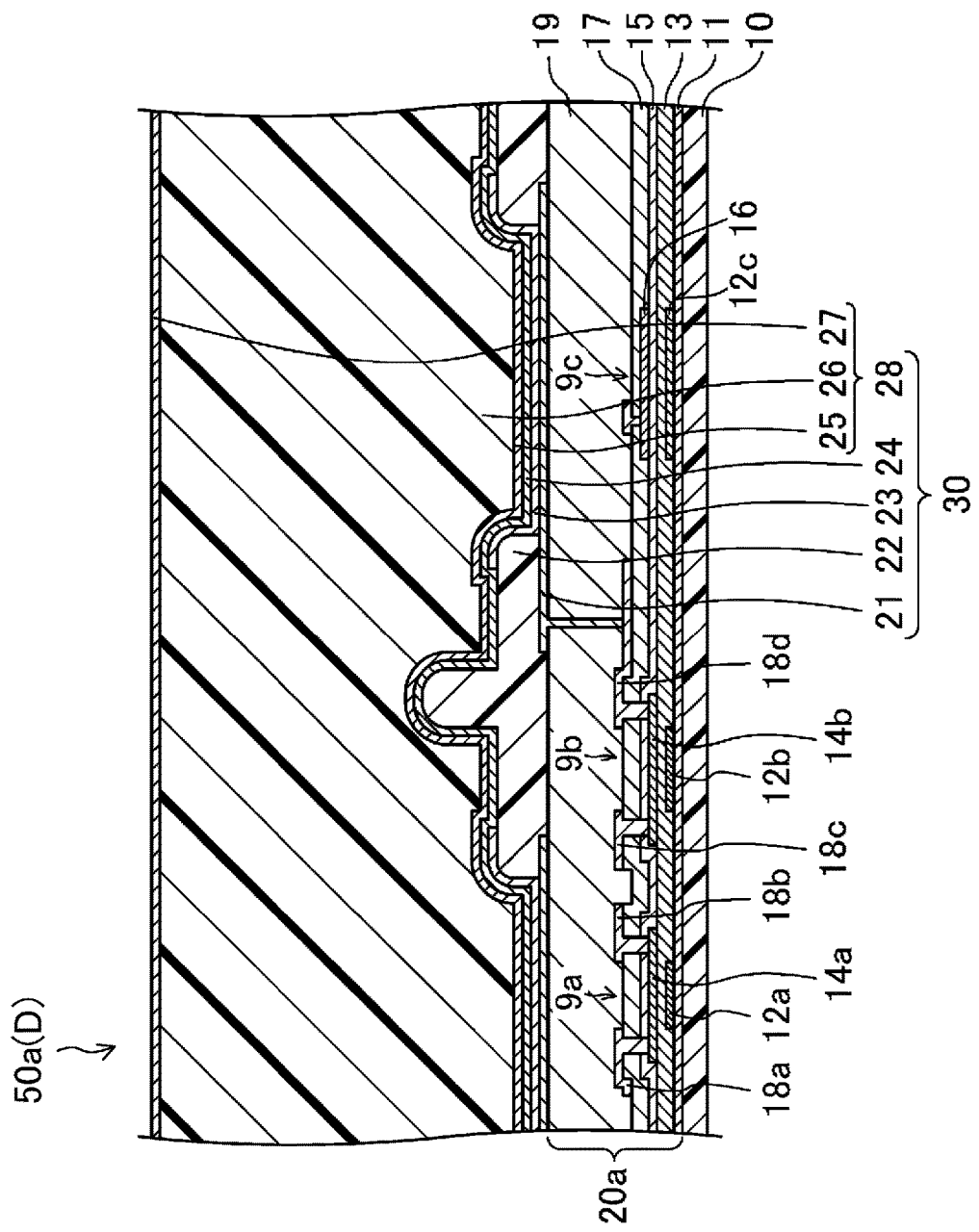
FIG. 3 is a cross-sectional view of the display region of the organic EL display device according to the first embodiment of the disclosure.
Figure 4:
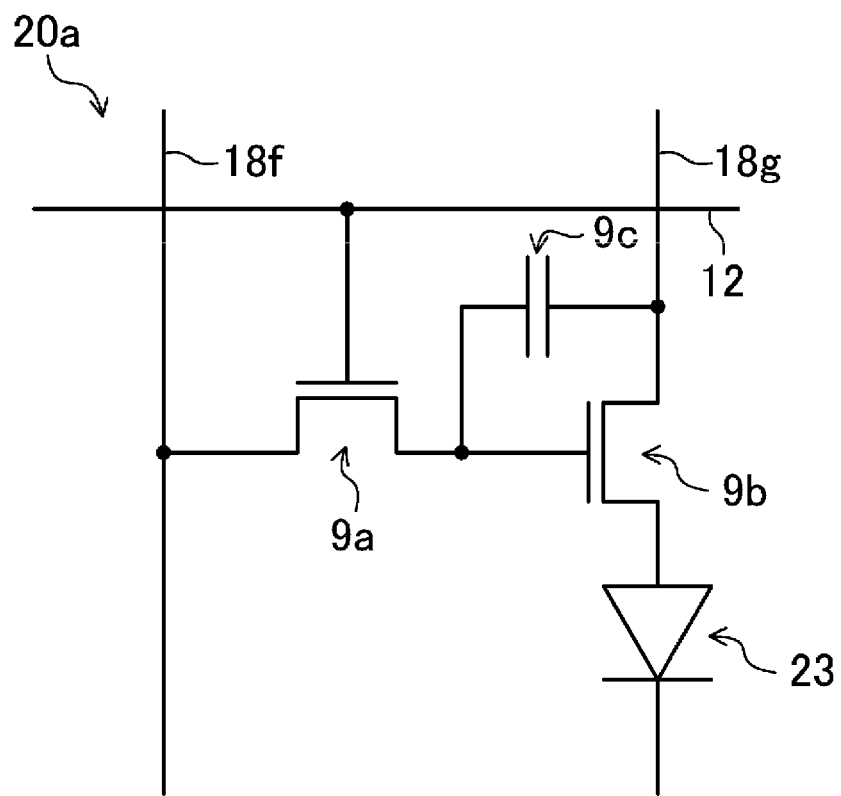
FIG. 4 is an equivalent circuit diagram of a TFT layer constituting the organic EL display device according to the first embodiment of the disclosure.
Figure 5:
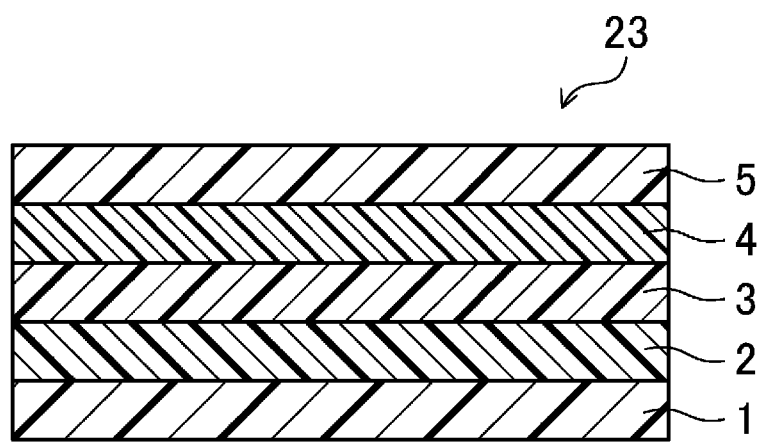
FIG. 5 is a cross-sectional view illustrating an organic EL layer constituting the organic EL display device according to the first embodiment of the disclosure.
Figure 6:
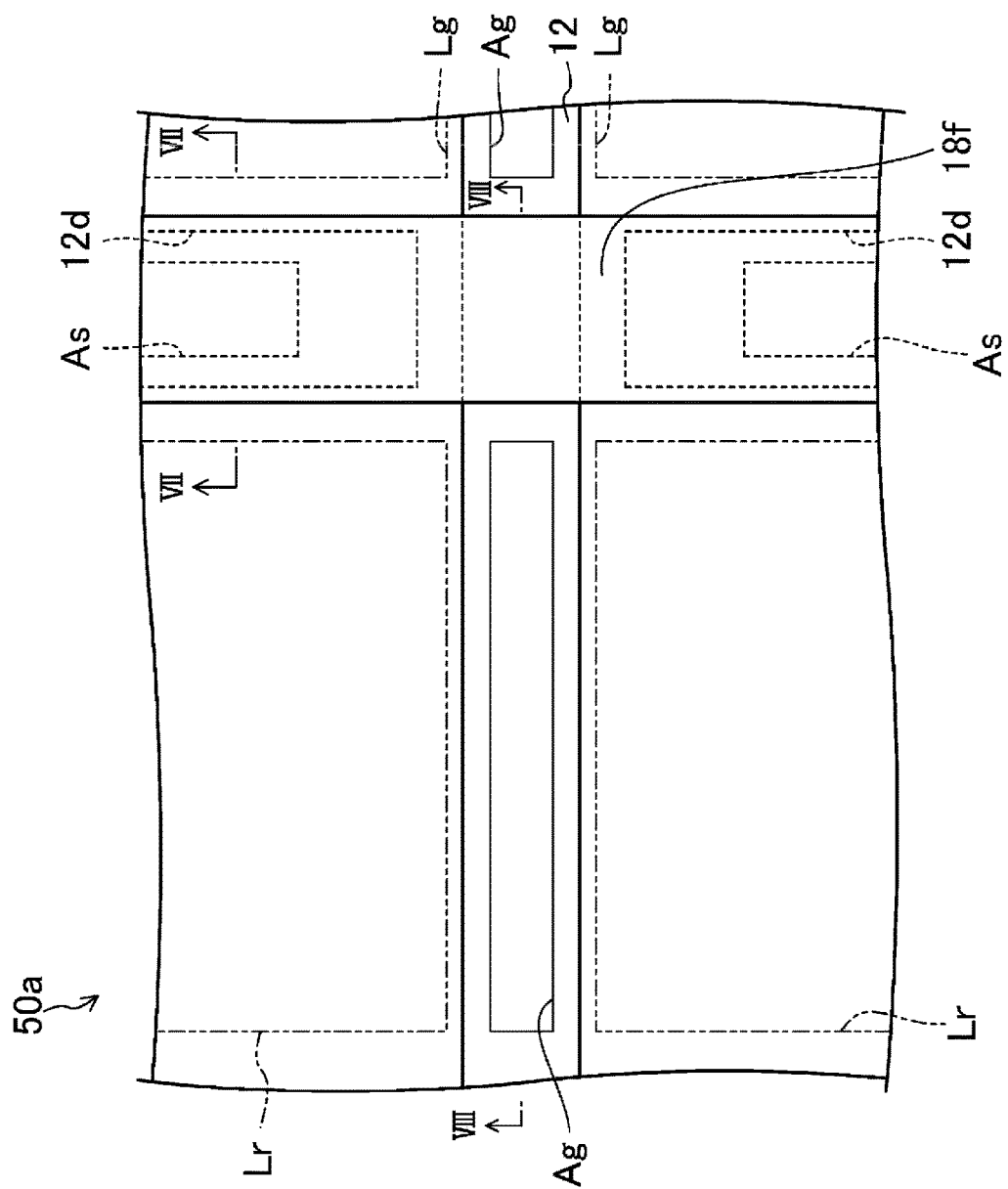
FIG. 6 is a plan view of main portions of a display region of the organic EL display device according to the first embodiment of the disclosure.
Figure 7:
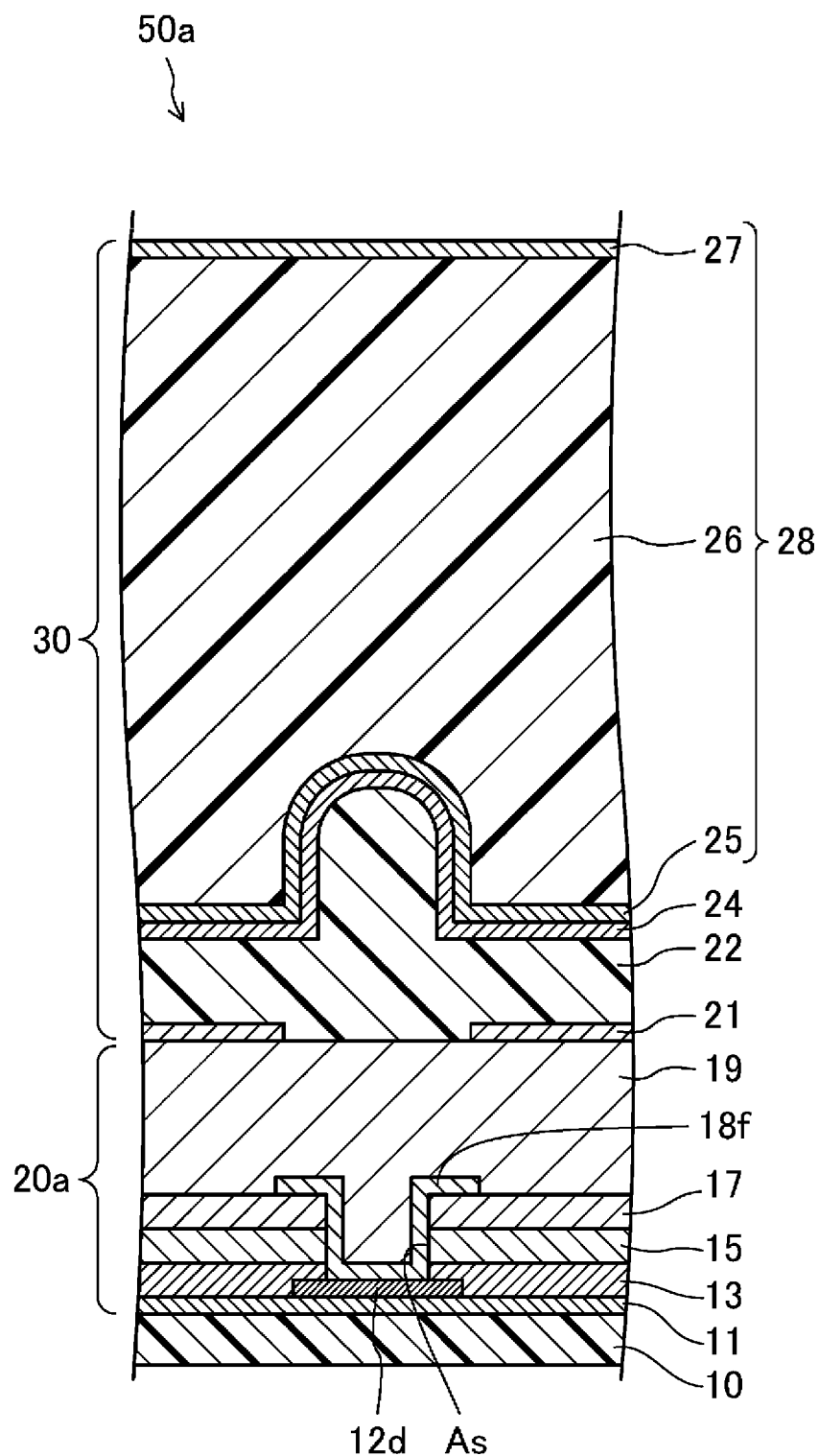
FIG. 7 is a cross-sectional view of main portions of the display region of the organic EL display device taken along the line VII-VII in FIG. 6.
Figure 8:
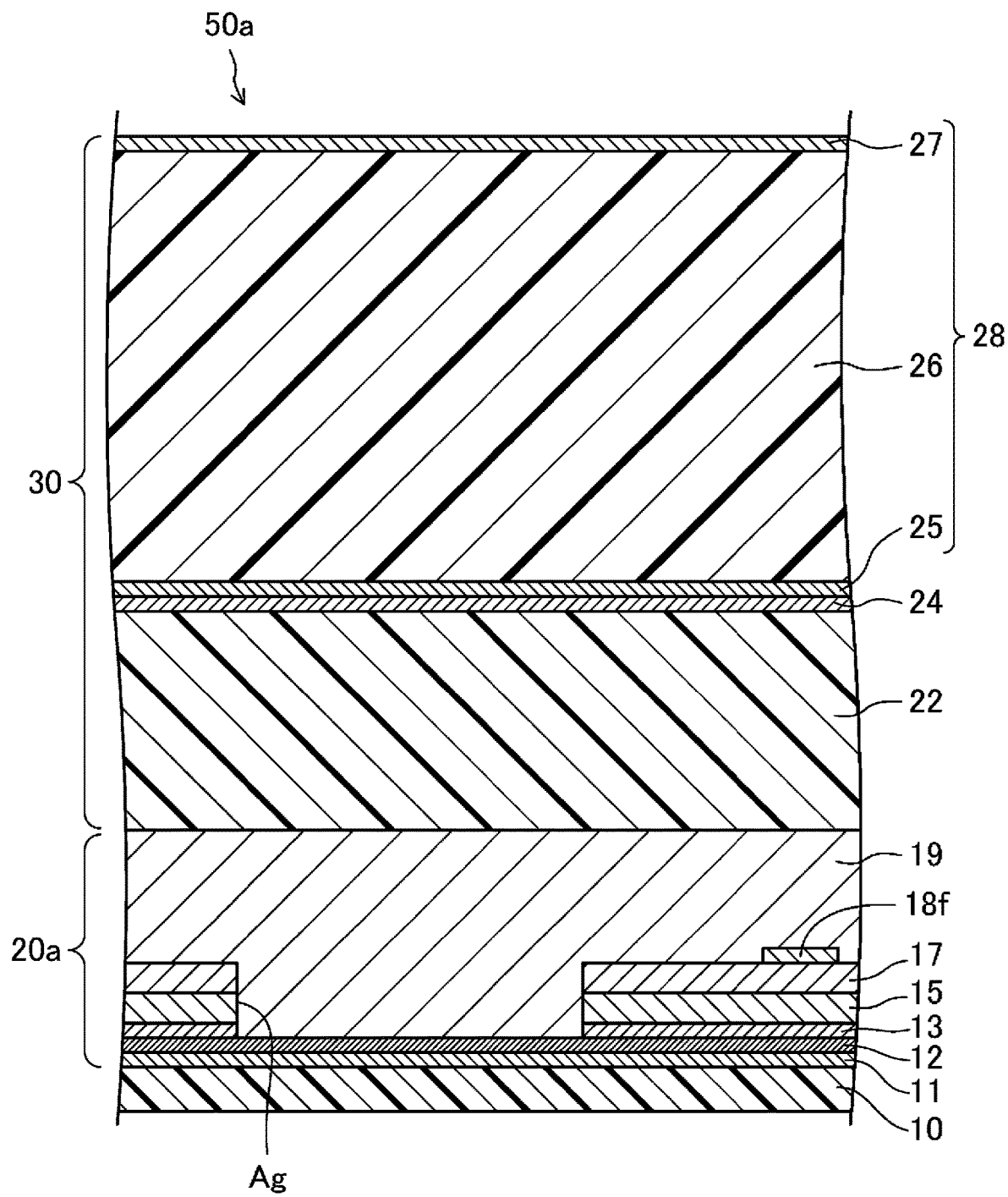
FIG. 8 is a cross-sectional view of main portions of a display region of the organic EL display device taken along the line VIII-VIII in FIG. 6.
Figure 9:
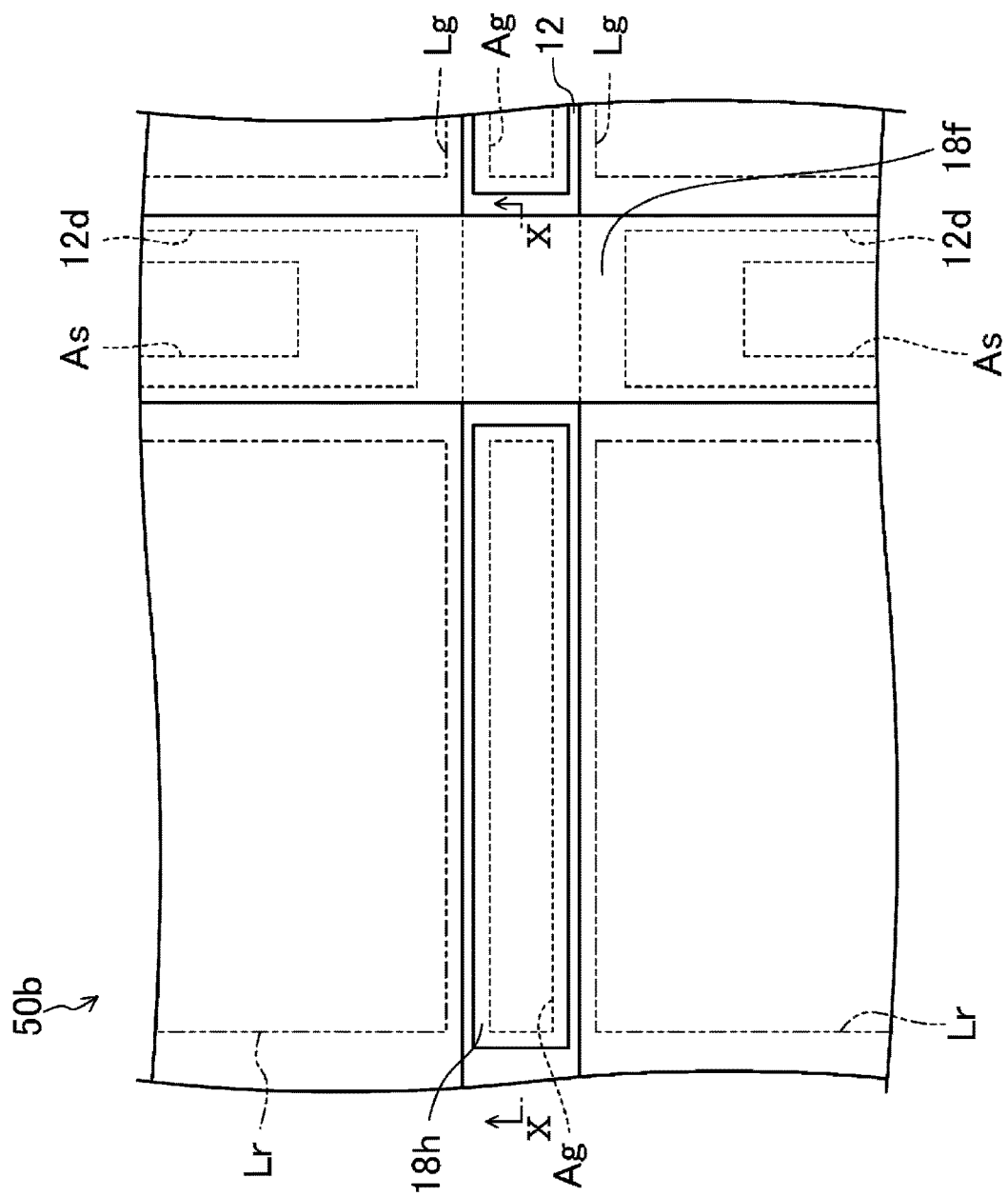
FIG. 9 is a plan view of main portions of a display region in a modified example of the organic EL display device according to the first embodiment of the disclosure, which corresponds to FIG. 6.
Figure 10:
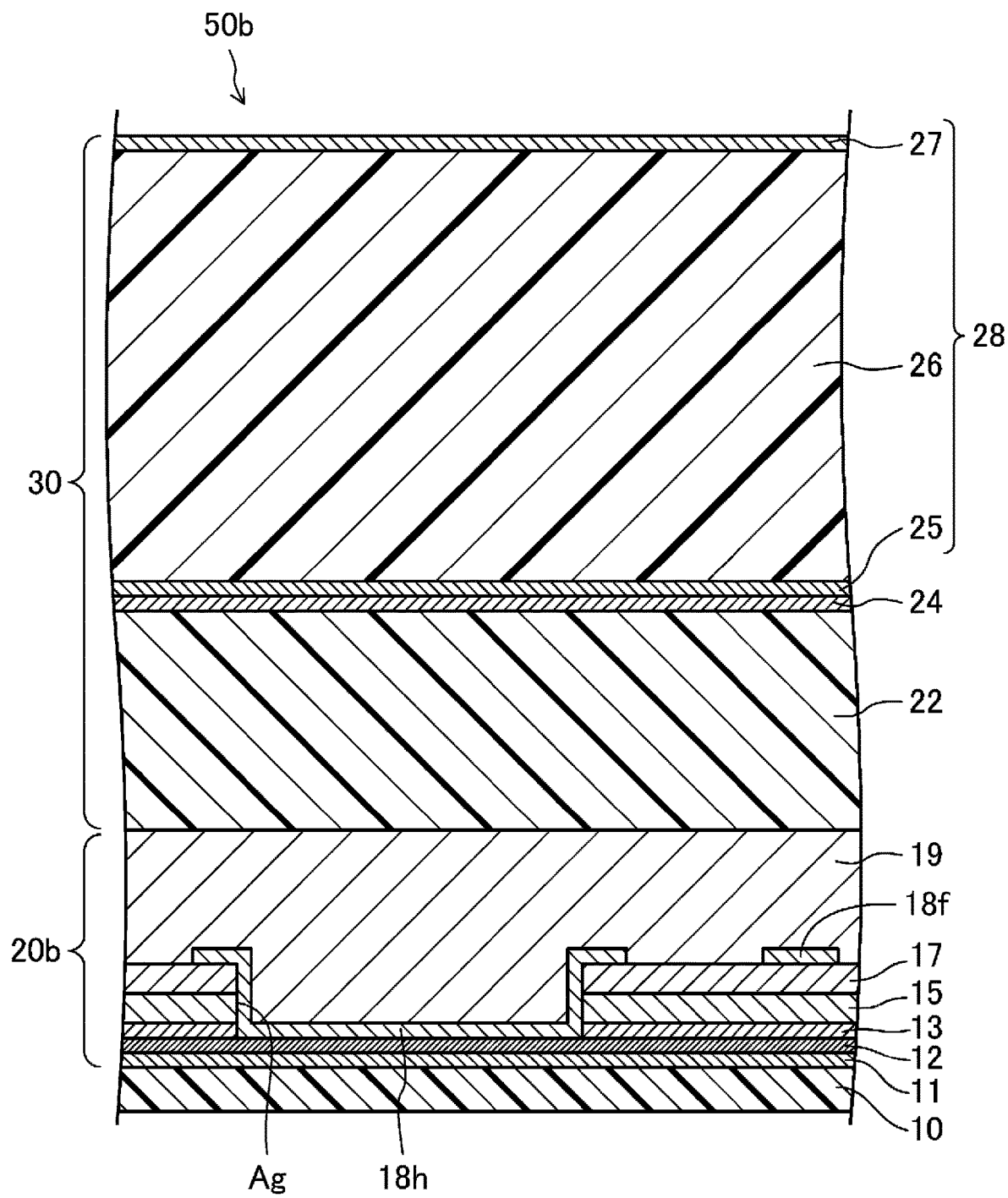
FIG. 10 is a cross-sectional view of main portions of the display region in the modified example of the organic EL display device taken along the line X-X in FIG. 9.

FIGS. 1 to 10 illustrate a first embodiment of a display device and a method for manufacturing the same according to the disclosure. Note that, in each of the following embodiments, an organic EL display device including an organic EL element will be described as a display device including a light-emitting element. Here, FIG. 1 is a plan view illustrating a schematic configuration of an organic EL display device 50a of the present embodiment. FIGS. 2 and 3 are a plan view and a cross-sectional view of the display region D of the organic EL display device 50a. FIG. 4 is an equivalent circuit diagram illustrating a TFT layer 20a constituting the organic EL display device 50a. FIG. 5 is a cross-sectional view illustrating the organic EL layer 23 constituting the organic EL display device 50a. FIG. 6 is a plan view of main portions of the display region D of the organic EL display device 50a. FIGS. 7 and 8 are cross-sectional views of main portions of the display region D of the organic EL display device 50a taken along lines VII-VII and VIII-VIII in FIG. 6. FIG. 9 is a plan view of main portions of a display region D of an organic EL display device 50b which is a modified example of the organic EL display device 50a, which corresponds to FIG. 6. FIG. 10 is a cross-sectional view of main portions of the display region D of the organic EL display device 50b taken along line X-X in FIG. 9. In the plan views of FIGS. 6 and 9, a power source line 18g (adjacent to the source line 18f) described below is omitted.

As illustrated in FIG. 1, the organic EL display device 50a includes, for example, a rectangular display region D for displaying an image and a frame region F provided around the display region D.

In the display region D, as illustrated in FIG. 2, a plurality of subpixels P are arranged in a matrix shape. Additionally, in the display region D, as illustrated in FIG. 2, a subpixel P including a red light-emitting region Lr for displaying red, a subpixel P including a green light-emitting region Lg for displaying green, and a subpixel P including a blue light-emitting region Lb for displaying blue are provided adjacent to each other. Here, in the display region D, for example, three adjacent subpixels P each including a red light-emitting region Lr, a green tight-emitting region Lg, and a blue tight-emitting region Lb constitute one pixel.

As illustrated in FIG. 3, the organic EL display device 50a includes a resin substrate layer 10 provided as a resin substrate, a thin film transistor (TFT) layer 20a provided on the resin substrate layer 10, and an organic EL element 30 provided as a light-emitting element constituting a display region D on the TUFT layer 20a.

The resin substrate layer 10 is formed, for example, of polyimide resin or the like.

As illustrated in FIG. 3, the TFT layer 20a includes a base coat film 11 provided on the resin substrate layer 10, a plurality of first TFTs 9a, a plurality of second TFTs 9b and a plurality of capacitors 9c, which are provided on the base coat film 11, and a flattening film 19 provided on each of the first TFTs 9a, each of the second TFTs 9b and each of the capacitors 9c. Here, in the TFT layer 20a, as illustrated in FIGS. 2 and 4, a plurality of gate lines 12 are provided as first wiring lines so as to extend in parallel to each other in the lateral direction in the drawing. Further, in the TFT layer 20a, as illustrated in FIGS. 2 and 4, a plurality of source lines 18f are provided as second wiring lines so as to extend in parallel to each other in the vertical direction in the drawing. Moreover, in the TFT layer 20a, as illustrated in FIGS. 2 and 4, a plurality of power source lines 18g are provided so as to extend in parallel to each other in the vertical direction in the drawing. Each of power source lines 18g is provided adjacent to each source line 18f, In the TFT layer 20a, as illustrated in FIG. 4, each subpixel P includes the first TFT 9a, the second TFT 9b, and the capacitor 9c.

The base coat film 11 is formed of a single layer film or a layered film of an inorganic insulating film of, for example, silicon nitride, silicon oxide, silicon oxide nitride, or the like.

As illustrated in FIG. 4, first TFT 9a is connected to the corresponding gate line 12 and the source line 18f in each subpixel P. As illustrated in FIG. 3, the first TFT 9a includes a gate electrode 12a, a gate insulating film 13, a semiconductor layer 14a, a first interlayer insulating film 15, a second interlayer insulating film 17, a source electrode 18a, and a drain electrode 18b, which are sequentially provided on the base coat film 11. Here, as illustrated in FIG. 3, the gate electrode 12a is provided in an island shape on the base coat film 11. Further, the gate insulating film 13 is provided so as to cover the gate electrode 12a, as illustrated in FIG. 3. As illustrated in FIG. 3, the semiconductor layer 14a is provided on the gate insulating film 13 so as to overlap the gate electrode 12a, and includes a channel region overlapping the gate electrode 12a, and a source region and a drain region arranged to sandwich the channel region. As illustrated in FIG. 3, the first interlayer insulating film 15 and the second interlayer insulating film 17 are provided in this order so as to cover the channel region of the semiconductor layer 14a, As illustrated in FIG. 3, the source electrode 18a and the drain electrode 18b are provided on the second interlayer insulating film 17 so as to be separated from each other. As illustrated in FIG. 3, the source electrode 18a and the drain electrode 18b are respectively connected to the source region and the drain region of the semiconductor layer 14a through each contact hole formed in the laminated films of the first interlayer insulating film 15 and the second interlayer insulating film 17. The gate insulating film 13, the first interlayer insulating film 15, and the second interlayer insulating film 17 are formed of, for example, a single layer film or a layered film of an inorganic insulating film of such as silicon nitride, silicon oxide, or silicon oxynitride.

As illustrated in FIG. 4, the second TFT 9b is connected to the corresponding first TFT 9a and the power source line 18g in each subpixel P. As illustrated in FIG. 3, the first TFT 9b includes a gate electrode 12b, a gate insulating film 13, a semiconductor layer 14b, a first interlayer insulating film 15, a second interlayer insulating film 17, a source electrode 18c, and a drain electrode 18d, which are sequentially provided on the base coat film 11. Here, as illustrated in FIG. 3, the gate electrode 12b is provided in an island shape on the base coat film 11. Further, the gate insulating film 13 is provided so as to cover the gate electrode 12b, as illustrated in FIG. 3. As illustrated in FIG. 3, the semiconductor layer 14b is provided on the gate insulating film 13 so as to overlap the gate electrode 12b, and includes a channel region overlapping the gate electrode 12b, and a source region and a drain region arranged to sandwich the channel region. As illustrated in FIG. 3, the first interlayer insulating film 15 and the second interlayer insulating film 17 are provided in this order so as to cover the channel region of the semiconductor layer 14b. Additionally, as illustrated in FIG. 3, the source electrode 18c and the drain electrode 18d are provided on the second interlayer insulating film 17 so as to be separated from each other. As illustrated in FIG. 3, the source electrode 18c and the drain electrode 18d are respectively connected to the source region and the drain region of the semiconductor layer 14b through each contact hole formed in the laminated films of the first interlayer insulating film 15 and the second interlayer insulating film 17.

Although the bottom gate type first TFT 9a and the second TFT 9b are illustrated in the present embodiment, the first TFT 9a and the second TFT 9b may be of top gate type.

As illustrated in FIG. 4, the capacitor 9c is connected to the corresponding first TFT 9a and the power source line 18g in each subpixel P. Here, as illustrated in FIG. 3, the capacitor 9c includes a lower conductive layer 12c formed of the same material as that of the gate electrode 12a or the like in the same layer as a layer of the gate electrode 12a or the like, a gate insulating film 13 and the first interlayer insulating film 15 provided in order so as to cover the lower conductive layer 12c, and an upper conductive layer 16 provided on the first interlayer insulating film 15 to overlap the lower conductive layer 12c. The upper conductive layer 16 is electrically connected to the power source line 18g.

The flattening film 19 is formed of, for example, an organic resin material such as polyimide resin.

As illustrated in FIG. 3, the organic EL element 30 includes a plurality of first electrodes 21, an edge cover 22, a plurality of organic EL layers 23, a second electrode 24, and a sealing film 28, which are sequentially provided on the flattening film 19.

As illustrated in HG. 3, the plurality of first electrodes 21 are provided in a matrix shape on the flattening film 19 so as to correspond to the plurality of subpixels P. As illustrated in FIG. 3, the first electrode 21 is connected to the drain electrode 18d of each of the second TFTs 9b through contact holes formed in the flattening film 19. The first electrode 21 has a function of injecting holes (positive hole) into the organic EL layer 23. The first electrode 21 is more preferably formed of a material having a large work function in order to improve the hole injection efficiency into the organic EL layer 23. Examples of the material constituting the first electrode 21 include metal materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (Lin, platinum (Pt), palladium (Pd), molybdenum (Mo), iridium (Ir), and tin (Sn). Additionally, the material constituting the first electrode 21 may be an alloy such as astatine (At)/astatine oxide ($AtO_2$). Further, the material constituting the first electrode 21 may be a conductive oxide such as tin oxide (SnO), zinc oxide (ZnO), indium tin oxide (ITO), or indium zinc oxide (IZO). Moreover, the first electrode 21 may be formed by layering a plurality of layers made of the above-described materials. Additionally, examples of the compound material having a large work function include indium tin oxide (ITO) and indium zinc oxide (IZO) or the like.

As illustrated in FIG. 3, the edge cover 22 is provided in a lattice pattern so as to cover the peripheral portion of each first electrode 21. Here, examples of the material constituting the edge cover 22 include organic films of polyimide resin, acrylic resin, polysiloxane resin, novolac resin, or the like.

As illustrated in FIG. 3, the plurality of organic EL layers 23 are disposed on the respective first electrodes 21 and provided in a matrix shape so as to correspond to the plurality of subpixels. As illustrated in FIG. 5, each organic EL layer 23 includes a hole injection layer 1, a hole transport layer 2, a light-emitting layer 3, an electron transport layer 4, and an electron injection layer 5, which are provided in this order on the first electrode 21.

The hole injection layer 1 is also referred to as an anode electrode buffer layer, and has a function of bringing the energy levels of the first electrode 21 and the organic EL layer 23 close to each other and improving the hole injection efficiency from the first electrode 21 to the organic EL layer 23, Examples of the material constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives, or the like.

The hole transport layer 2 has a function of improving the transport efficiency of holes from the first electrode 21 to the organic layer 23. Here, examples of materials constituting the hole transport layer 2 include porphyrin derivatives, aromatic tertiary amine compounds, styrylamine derivatives, polyvinylcarbazole, poly-p-phenlyenemide derivatives, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide, or the like.

The light-emitting layer 3 is a region where holes and electrons are injected from the first electrode 21 and the second electrode 24, respectively, and the holes and the electrons recombine, when a voltage is applied via the first electrode 21 and the second electrode 24, Here, the light-emitting layer 3 is formed of a material having high luminous efficiency. Examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, henzothiazole derivatives, styryl derivatives, styrylamine derivatives, bisstyrylbenzene derivatives, trisstyrylhenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane, or the like.

The electron transport layer 4 functions to facilitate migration of electrons to the light-emitting layer 3 efficiently. Examples of materials constituting the electron transport layer 4 include, as organic compounds, oxadiazole derivative, triazole derivative, benzoquinone derivative, naphthoquinone derivative, anthraquinone derivative, tetracyanoanthraquinodimethane derivative, diphenoquinone derivative, fluorenone derivative, silole derivative, and metal oxinoid compound, or the like.

The electron injection layer 5 has a function of bringing the energy levels of the second electrode 24 and the organic EL layer 23 close to each other to improve the efficiency of injection of electrons from the second electrode 24 into the organic EL layer 23, and this function can lower the drive voltage of the organic EL element 30. The electron injection layer 5 is also referred to as a cathode buffer layer. Examples of the material constituting the electron injection layer 5 include inorganic alkaline compound such as lithium fluoride (LiF), magnesium fluoride ($MgE_2$), calcium fluoride ($CaF_2$), strontium fluoride ($SrF_2$), or barium fluoride ($BaF_2$); aluminum oxide ($Al_2O_3$); and strontium oxide (SrO), or the like.

As illustrated in FIG. 3, the second electrode 24 is provided to cover each organic EL layer 23 and each edge cover 22. Moreover, the second electrode 24 functions to inject electrons into the organic EL layer 23. The second electrode 24 is preferably constituted of a material having a small work function to improve the electron injection efficiency into the organic EL layer 23. Examples of the material constituting the second electrode 24 include, for example, silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF), or the like. The second electrode 24 may be, for example, formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), or the like. Additionally, the second electrode 24 may be formed of an electrically conductive oxide such as tin oxide (SnO), zinc oxide (ZnO), indium tin oxide (ITO), and indium zinc oxide (IZO). The second electrode 24 may be formed by layering a plurality of layers made of the above-described materials. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

The sealing film 28 includes, as illustrated in FIG. 3, a first inorganic film 25 provided so as to cover the second electrode 24, an organic film 26 provided on the first inorganic film 25, and a second inorganic film 27 provided so as to cover the organic film 26, and functions to protect the organic EL layer 23 from moisture and oxygen or the like. The first inorganic film 25 and the second inorganic film 27 are formed of an inorganic material such as, for example, silicon oxide ($SiO_2$) or aluminum oxide ($Al_2O_3$), silicon nitride ($SiN_x$ (x denoting a positive integer)) like trisilicon tetranitride ($Si_3N_4$), or silicon carbide nitride (SiCN). The organic film 26 is formed of an organic material such as an acrylic resin, a polyurea resin, a parylene resin, a polyimide resin, or a polyamide resin.

As illustrated in FIGS. 6 to 8, in the TFT layer 20a of the organic EL display device 50a, in the display region D, the gate line 12 and the conductive layer 12d are provided as an etching stopper layers between the base coat film 11 and the gate insulating film 13. Further, in the organic EL display device 50a, as illustrated in FIGS. 6 and 7, in the display region D, openings Ag and As are formed in the gate insulating film 13, the first interlayer insulating film 15, and the second interlayer insulating film 17, which are closer to the organic EL element 30 than the gate line 12 and the conductive layer 12d, and are formed to extend through the gate insulating film 13, the first interlayer insulating film 15, and the second interlayer insulating film 17, thereby exposing the upper surfaces of the gate line 12 and the conductive layer 12d. Here, as illustrated in FIG. 6, the openings Ag and As are provided in an island shape between the light-emitting regions Lr, and between the light-emitting regions Lr and Lg, of a pair of adjacent subpixels P. As illustrated in FIGS. 7 and 8, a flattening film 19 is provided in the openings Ag and As so as to fill the openings Ag and As. Furthermore, as illustrated in FIGS. 6 and 7, a source line 18f is provided between the opening As and the flattening film 19, Since the source line 18f and the conductive layer 12d are electrically connected to each other through the opening As, the wiring line resistance of each source line 18f can be reduced.

In the organic EL display device 50a of the present embodiment, another power source line formed of the same material as a material of the gate line 12 or the upper conductive layer 16 in the same layer as a layer of the gate line 12 or the upper conductive layer 16 is provided between the adjacent gate lines 12, and the opening As is disposed so as not to overlap the another power source line (not illustrated). In the organic EL display device 50a of the present embodiment, the power source line 18g is provided between the adjacent source lines 18f, and the opening Ag is disposed so as not to overlap the power source line 18g (not illustrated).

In addition, in the present embodiment, the organic EL display device 50a, in which the flattening film 19 is directly provided in the opening Ag, is exemplified, but as illustrated in FIGS. 9 and 10, an organic EL display device 50b, in which a metal layer 18h is provided between the opening Ag and the flattening film 19, may be used.

Specifically, as illustrated in FIGS. 9 and 10, in the TFT layer 20b constituting the organic EL display device 50b, the metal layer 18h is provided in an island shape between the opening Ag and the flattening film 19 so as to cover the gate line 12 exposed from the opening Ag and the peripheral end portion of the opening Ag. Here, the metal layer 18h is formed of the same material as that of the source line 18f in the same layer as a layer of the source line 18f. Since each gate line 12 and the metal layer 18h are electrically connected through the opening Ag, the wiring line resistance of each gate line 12 can be reduced.

In addition, in the present embodiment, the organic EL display device 50a, in which the gate line 12 and the conductive layer 12d are provided as the etching stopper layers, is exemplified, but the etching stopper layer may be, for example, a conductive layer formed of the same material as that of the upper conductive layer 16 in the same layer as a layer of the upper conductive layer 16.

In the organic EL display device 50a described above, in each subpixel P, a gate signal is inputted into the first TFT 9a through the gate line 12 to thereby turn on the first TFT 9a, a predetermined voltage corresponding to a source signal is written in the gate electrode 12b of the second TDT 9b and the capacitor 9c through the source line 18f, the magnitude of current from the power source line 18g is specified based on a gate voltage of the second TFT 9b, and the specified current is supplied to the organic EL layer 23, whereby the light-emitting layer 3 of the organic EL layer 23 emits light to display an image. In the organic EL display device 50a, even when the first TFT 9a is turned off, the second TFT 9b gate voltage is held by the capacitor 9c, light emission by the light-emitting layer 3 is maintained until the gate signal of the next frame is input.

Next, a method for manufacturing the organic EL display device 50a of the present embodiment will be described. The method for manufacturing the organic EL display device 50a according to the present embodiment includes a ITT layer forming step including an opening forming step and a flattening film forming step, and an organic EL element forming step.

TFT Layer Forming Step

For example, an inorganic insulating film (about 50 nm thick) of silicon nitride or the like is formed by, for example, plasma chemical vapor deposition (CVD) method on the resin substrate layer 10 formed on the glass substrate to form the base coat film 11.

Subsequently, a metal film (about 300 nm thick such as a titanium film is formed, by a sputtering method, on the entire substrate on which the base coat film 11 is formed, and then the metal film is subjected to a photolithography process, an etching process, and a resist peeling process, thereby forming the gate line 12, the gate electrodes 12a and 12b, the lower conductive layer 12c, as well as the conductive layer 12d.

Then, an inorganic insulating film (about 100 nm thick) such as a silicon nitride film is formed by plasma CVD method on the entire substrate on which the gate lines 12 or the like are formed, thereby forming the gate insulating film 13.

Further, an intrinsic amorphous silicon film (about 50 nm thick) is formed, by, for example, a plasma CVD method, on the entire substrate on which the gate insulating film 13 is formed, and then polycrystallized by an annealing process such as laser light irradiation to form a polysilicon film, and the polysilicon film is subjected to a photolithography process, an etching process, and a resist peeling process to form the semiconductor layers 14a and 14b. In the present embodiment, although a method of forming the semiconductor layers 14a and 14b with a polysilicon film is exemplified, the semiconductor layers 14a and 14b may be formed of an In—Ga—Zn—O oxide semiconductor film such as InGaZnO$_4$ or an amorphous silicon film or the like.

Subsequently, an inorganic insulating film (about 300 nm thick) such as a silicon nitride film is formed by, for example, plasma CVD method on the entire substrate on which the semiconductor layers 14a and 14b are formed, thereby forming a first interlayer insulating film 15.

After that, a metal film (about 300 nm thick) such as a titanium film is formed, by, for example, a sputtering method, on the entire substrate on which the first interlayer insulating film 15 is formed, and then a photolithography process, an etching process, and a resist peeling process are performed on the metal film, thereby forming the upper conductive layer 16 to form the capacitor 9c.

Further, an inorganic insulating film (about 300 nm thick) such as a silicon nitride film is formed, by, for example, plasma CVD method, on the entire substrate on which the upper conductive layer 16 is formed to form a second interlayer insulating film 17. Thereafter, the gate insulating film 13, the first interlayer insulating film 15, and the second interlayer insulating film 17 are appropriately subjected to a photolithography process, an etching process, and a resist peeling process, thereby forming the openings Ag and As (opening forming step).

Subsequently, a metal film (about 300 nm thick) such as a titanium film is formed, for example, by a sputtering method on the entire substrate in which the openings Ag and As are formed. Then, the source electrodes 18a and 18c, the drain electrodes 18b and 18d, the source line 18f, the power source line 18g, and the metal layer 18h are formed by performing a photolithography process, an etching process, and a resist peeling process on the metal film, thereby forming the first TFT 9a and the second TFT 9b or the like.

Further, a polyimide-based photosensitive resin film (about 2 μm thick) is applied by, for example, spin coating method or slit coating method to the entire substrate on which the first TFT 9a and the second TFT 9b or the like are formed, and then the applied film is subjected to prebaking, exposure, development, and postbaking to form the flattening film 19, thereby forming the TFT layer 20a (flattening film forming step).

Organic EL Element Forming Step

First, the first electrode 21, the edge cover 22, the organic EL layer 23 (the hole injection layer 1, the hole transport layer 2, the light-emitting layer 3, the electron transport layer 4, and the electron injection layer 5), and the second electrode 24 are formed, by known methods, on the TUFT layer 20a formed in the TFT layer forming step.

Subsequently, after the first inorganic film 25 such as a silicon nitride film is formed by, for example, a plasma CVD method so as to cover the second electrode 24, the organic film 26 is formed on the first inorganic film 25 by an inkjet method, and the second inorganic film 27 such as a silicon nitride film is further formed on the organic film 26 by a plasma CVD method, thereby forming the sealing film 28 to form the organic EL element 30.

Finally, the glass substrate is peeled from the lower surface of the resin substrate layer 10 by irradiating a laser beam from the glass substrate side of the resin substrate layer 10 on which the organic EL element 30 is formed.

As described above, the organic EL display device 50a of the present embodiment can be manufactured.

As described above, according to the organic EL display device 50a and the method for manufacturing the same of the present embodiment, in the display region D, the gate line 12 and the conductive layer 12d are provided as the etching stopper layers between the base coat film 11 and the gate insulating film 13. In the opening forming step, openings Ag and As are formed in the gate insulating film 13, the first interlayer insulating film 15, and the second interlayer insulating film 17, which are closer to the organic EL element 30 than the gate line 12 and the conductive layer 12d, and are formed to extend through the gate insulating film 13, the first interlayer insulating film 15, and the second interlayer insulating film 17, thereby exposing the upper surfaces of the gate line 12 and the conductive layer 12d. Further, the flattening film 19 is provided in the openings Ag and As so as to fill the openings Ag and As in the flattening film forming step. Accordingly, since film breakage of the gate insulating film 13, the first interlayer insulating film 15, and the second interlayer insulating film 17 is suppressed when the organic EL display device 50a is bent in the display region D, damage to the organic EL element 30 due to bending in the display region D can be suppressed.

Further, according to the organic EL display device 50a and the method for manufacturing the same according to the present embodiment, since the base coat film 11 is provided on the entire upper surface of the resin substrate layer 10, it is possible to prevent moisture or the like from entering the organic EL element 30 from the resin substrate layer 10.

Second Embodiment

Figure 11:
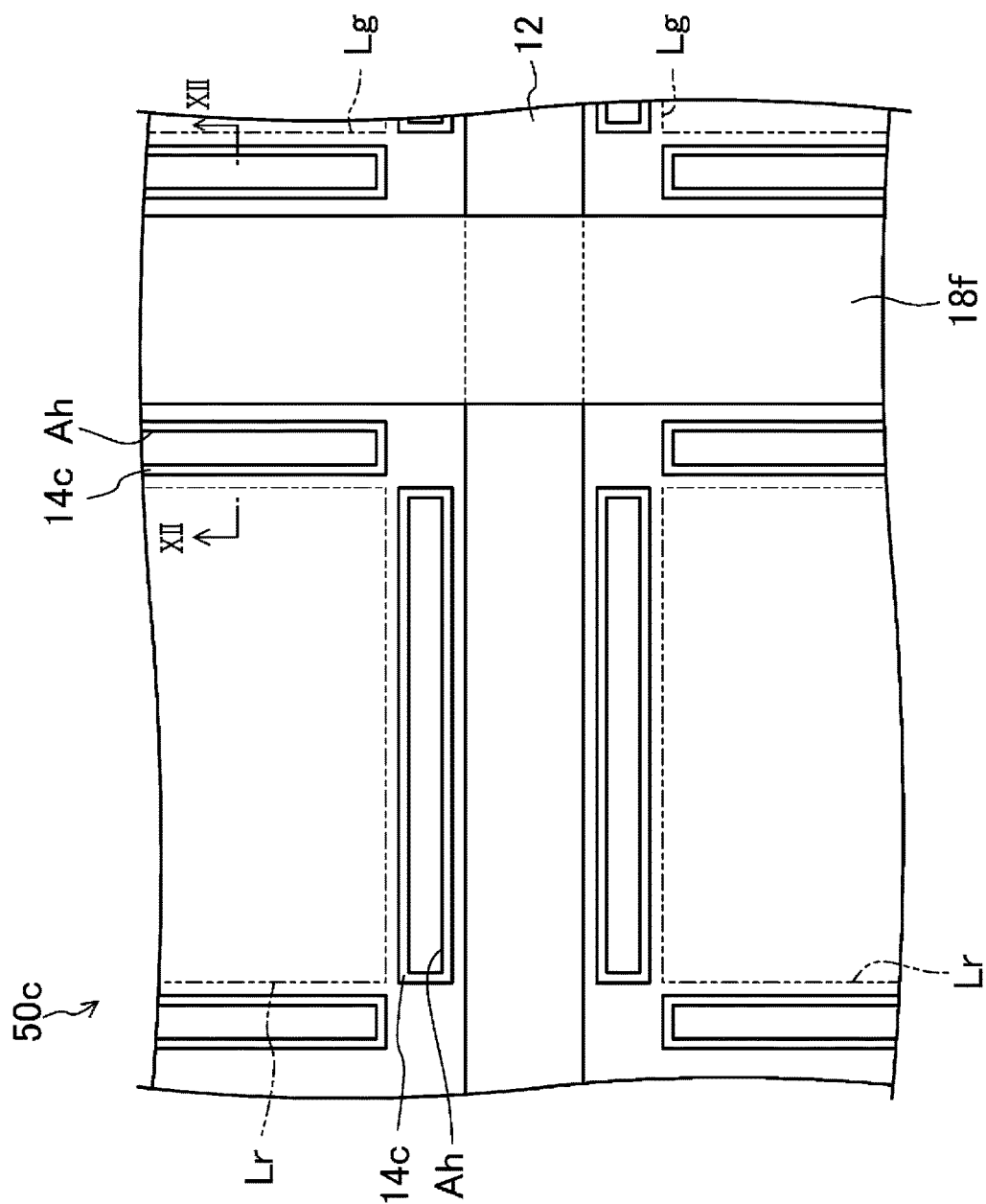
FIG. 11 is a plan view of main portions of a display region of an organic EL display device according to a second embodiment of the disclosure, which corresponds to FIG. 6.
Figure 12:
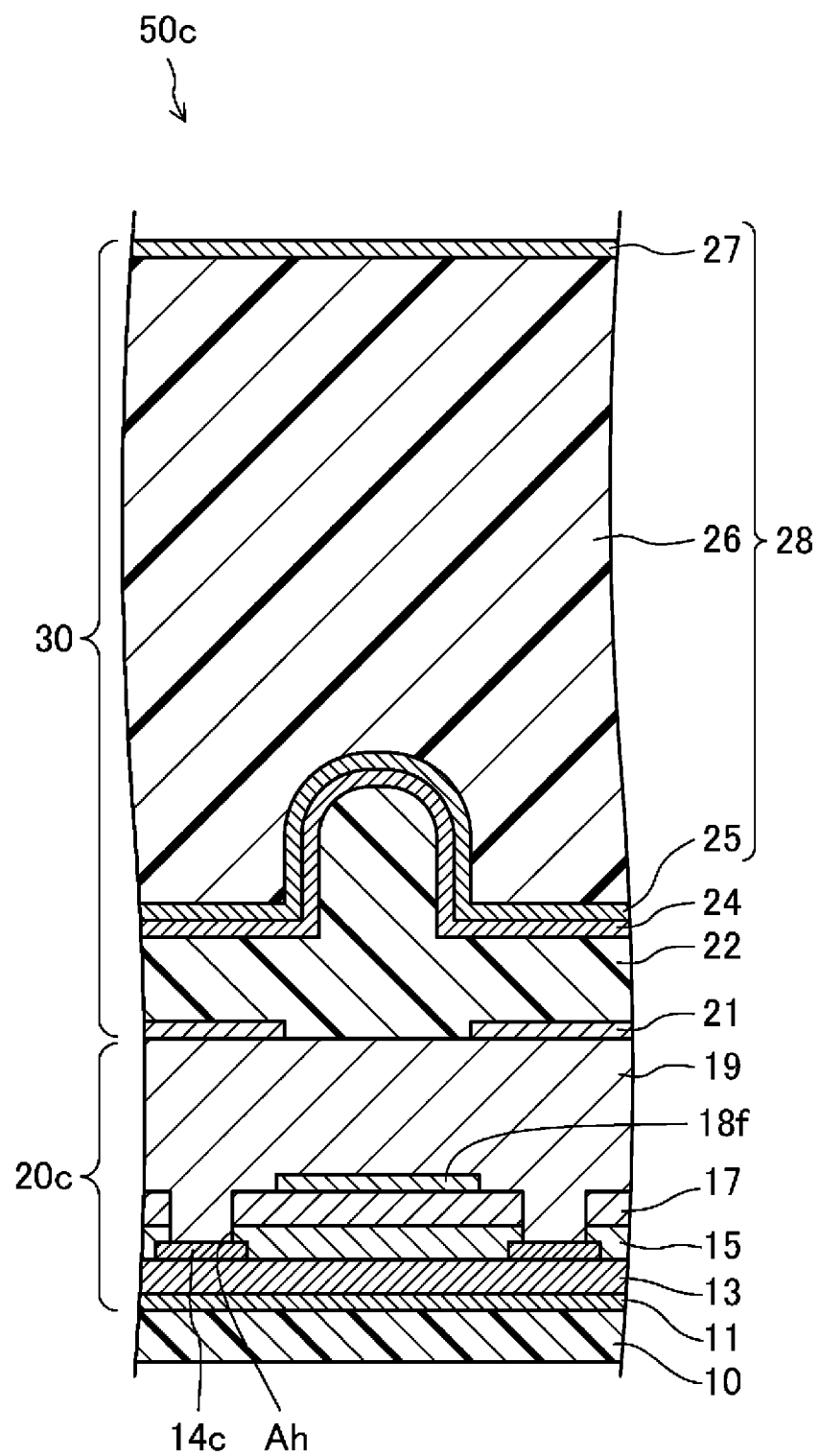
FIG. 12 is a cross-sectional view of main portions of the display region of the organic EL display device taken along the line XII-XII in FIG. 11.
Figure 13:
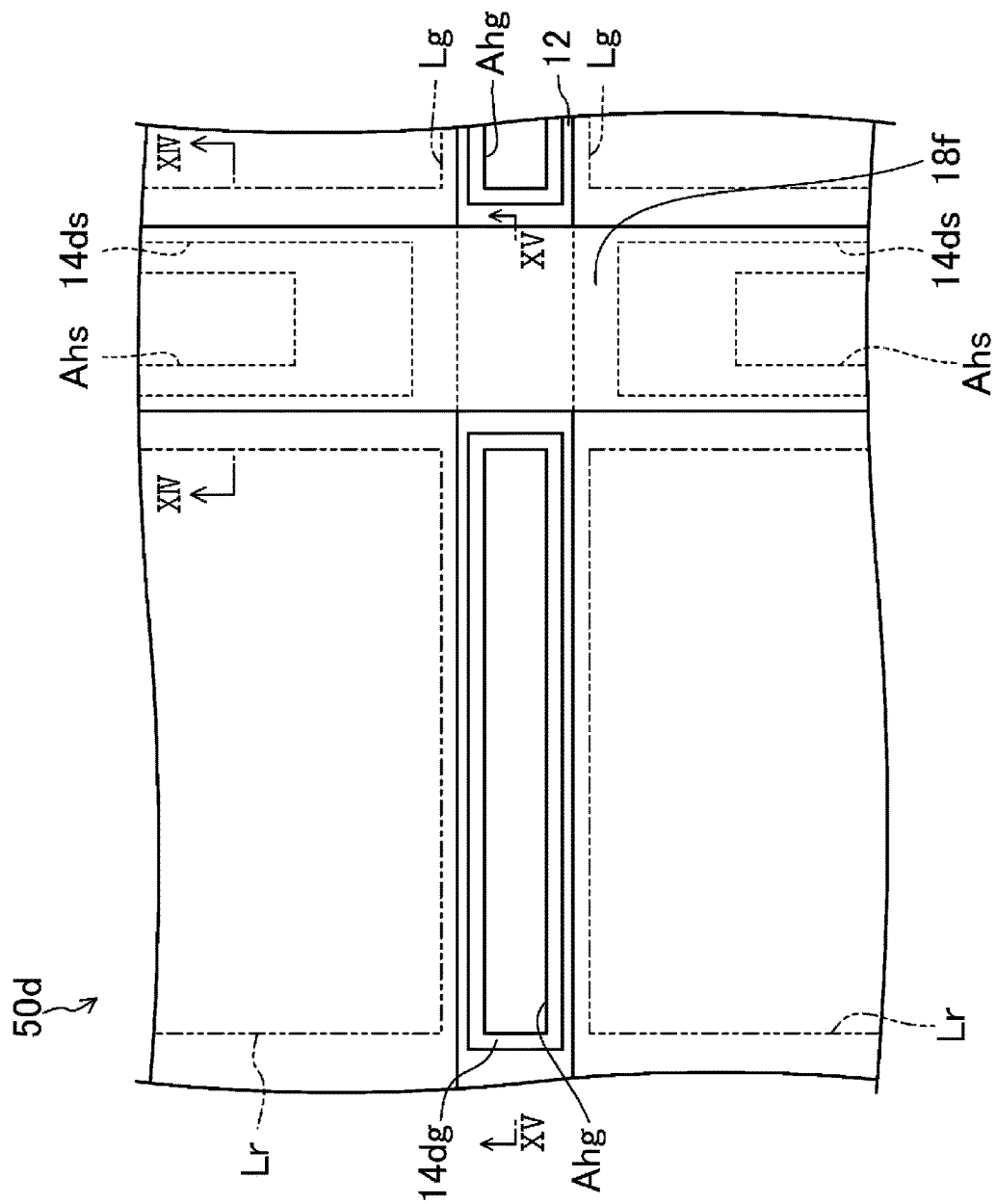
FIG. 13 is a plan view of main portions of a display region in a modified example of the organic EL display device according to the second embodiment of the disclosure, which corresponds to FIG. 6.
Figure 14:
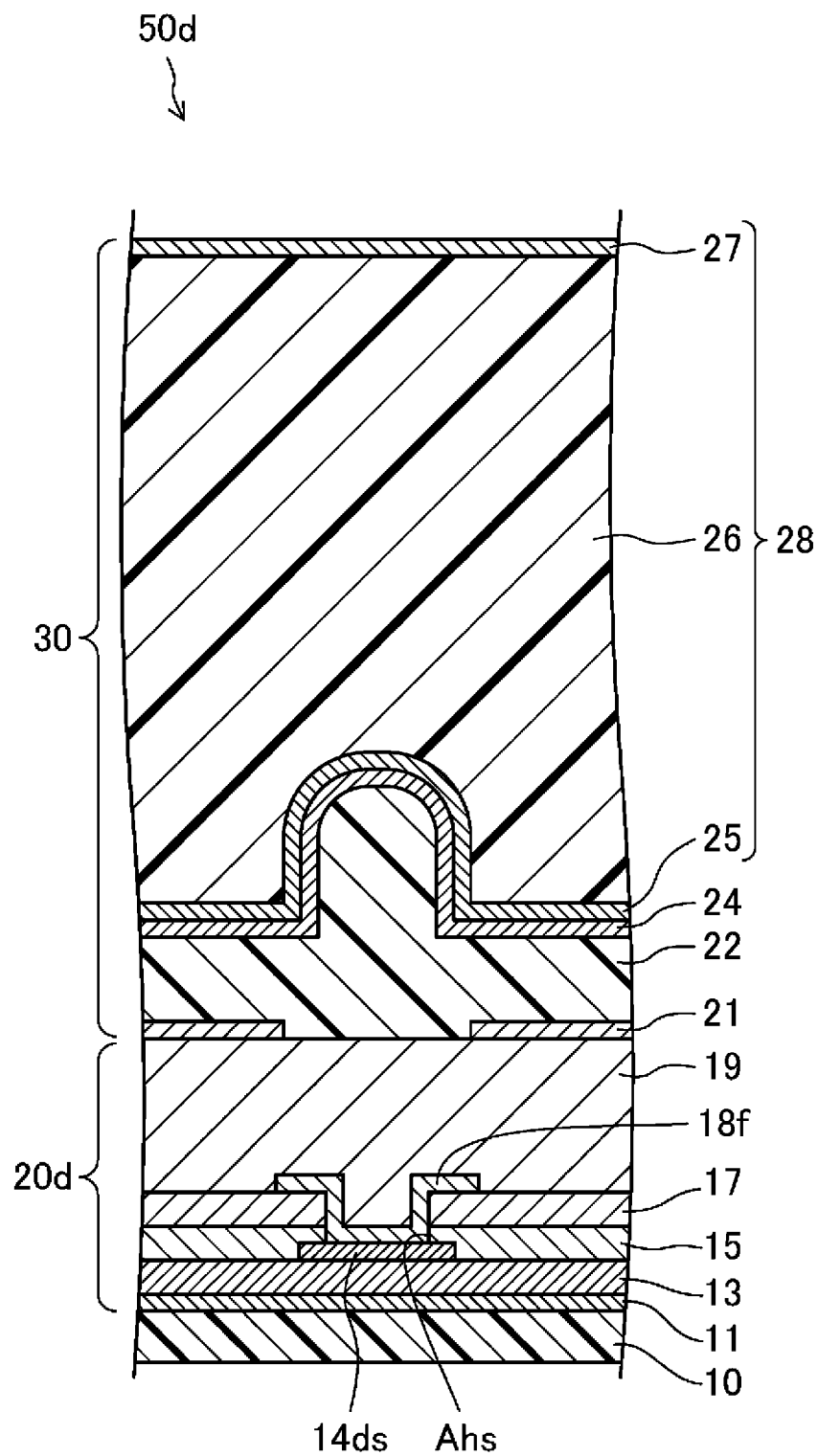
FIG. 14 is a cross-sectional view of main portions of the display region in the modified example of the organic EL display device taken along line XIV-XIV in FIG. 13.
Figure 15:
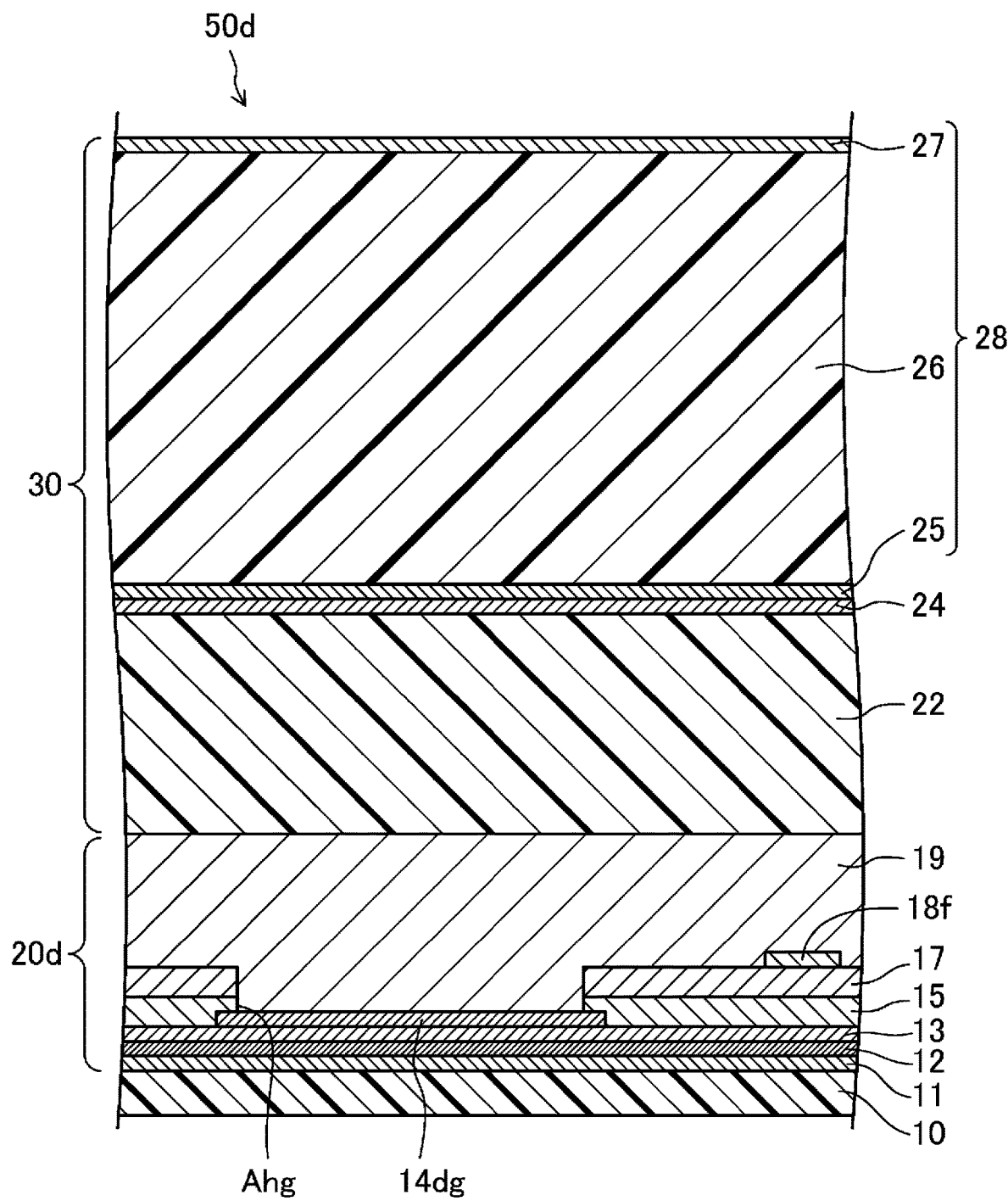
FIG. 15 is a cross-sectional view of main portions of the display region in the modified example of the organic EL display device taken along line XV-XV in FIG. 13.

FIGS. 11 to 15 illustrate a second embodiment of a display device and a method for manufacturing the same according to the disclosure. Here, FIG. 11 is a plan view of main portions of the display region D of an organic EL display device 50c according to the present embodiment, which corresponds to FIG. 6. FIG. 12 is a cross-sectional view of main portions of the display region D of the organic EL display device 50c taken along line XII-XII in FIG. 11. FIG. 13 is a plan view of main portions of a display region D of an organic EL display device 50d that is a modified example of the organic EL display device 50c, which corresponds to FIG. 6. FIGS. 14 and 15 are cross-sectional views of main portions of the display region D of the organic EL display device 50d taken along lines XIV-XIV and XV-XV in FIG. 13. In plan views of FIGS. 11 and 13, the power source line 18g adjacent to the source line 18f is omitted. Further, in each of the following embodiments, the same parts as those in FIGS. 1 to 10 are designated by the same reference numerals, and detailed description thereof will be omitted.

In the first embodiment, the organic EL display device 50a, in which the gate line 12 and the conductive layer 12d are provided as the etching stopper layers, is exemplified, but in the present embodiment, the organic EL display device 50c, in which the semiconductor layer 14c is provided as the etching stopper layer, is exemplified.

Similarly to the organic EL display device 50a according to the first embodiment, the organic EL display device 50c includes, for example, a rectangular display region D for displaying an image and a frame region F provided around the display region D.

As illustrated in FIG. 12, the organic EL display device 50c includes a resin substrate layer 10, a TFT layer 20c provided on the resin substrate layer 10, and an organic EL element 30 provided on the TFT layer 20c.

Similarly to the TFT layer 20a of the first embodiment, the TFT layer 20c includes a base coat film 11 provided on the resin substrate layer 10, a plurality of first TFTs 9a, a plurality of second TFTs 9b, and a plurality of capacitors 9c, which are provided on the base coat film 11, and a flattening film 19 provided on each of the first TFTs 9a, each of second TFTs 9b, and each of capacitors 9c. Here, in the TFT layer 20c, similarly to the TFT layer 20a of the first embodiment, a plurality of gate lines 12 are provided as first wiring lines so as to extend in parallel to each other. In addition, in the TFT layer 20c, similarly to the TFT layer 20a of the first embodiment, a plurality of source lines 18f are provided as second wiring lines so as to extend in parallel to each other. In addition, in the TFT layer 20c, similarly to the TFT layer 20a of the first embodiment, each power source line 18g is provided adjacent to each source line 18f. In the TFT layer 20c, similarly to the TFT layer 20a of the first embodiment, in each subpixel P, the first TFT 9a, the second TFT 9b, and the capacitor 9c are respectively provided.

In the TFT layer 20c, as illustrated in FIGS. 11 and 12, a semiconductor layer 14c is provided as an etching stopper layer between the gate insulating film 13 and the first interlayer insulating film 15 in the display region D. Here, the semiconductor layer 14c is formed of the same material as those of the semiconductor layers 14a and 14b in the same layer as a layer of the semiconductor layers 14a and 14b, Further, in the TFT layer 20c, as illustrated in FIGS. 11 and 12, in the display region D, an opening Ah is formed in the first interlayer insulating film 15 and the second interlayer insulating film 17, which are closer to the organic EL element 30 than the semiconductor layer 14c, and is formed to extend through the first interlayer insulating film 15 and the second interlayer insulating film 17, thereby exposing the upper surface of the semiconductor layer 14c. Here, as illustrated in FIG. 11, the openings Ah is provided in an island shape between the light-emitting regions Lr, and between light-emitting regions Lr and Lg, of a pair of adjacent subpixels P. As illustrated in FIG. 12, a flattening film 19 is provided in the opening Ah so as to fill the opening Ah.

In the organic EL display device 50c of the present embodiment, another power source line formed of the same material as that of the gate line 12 or the upper conductive layer 16 in the same layer as a layer of the gate line 12 or the upper conductive layer 16 is provided between the adjacent gate lines 12, and the opening Ah is disposed so as not to overlap the another power source line (not illustrated). Further, in the organic EL display device 50c of the present embodiment, the power source line 18g is provided between the adjacent source lines 18f, and the opening Ah is disposed so as not to overlap the power source line 18g (not illustrated).

In addition, in the present embodiment, the organic EL display device 50c, in which the semiconductor layer 14c is provided between the light-emitting regions Lr, Lg, and Lb, and the gate line 12 and the source line 18f, is exemplified, but as illustrated in FIGS. 13 to 15, the organic EL display device 50d, in which the semiconductor layers 14dg and 14ds are provided so as to overlap the gate line 12 and the source line 18f, may be used.

Specifically, as illustrated in FIGS. 13 to 15, in the TFT layer 20d constituting the organic EL display device 50d, the semiconductor layers 14dg and 14ds are provided as etching stopper layers so as to overlap each of the gate lines 12 and each of the source lines 18f, Here, the semiconductor layers 14dg and 14ds are formed of the same material as those of the semiconductor layers 14a and 14b in the same layer as a layer of the semiconductor layers 14a and 14b. Further, in the TFT layer 20d, as illustrated in FIGS. 13 to 15, in the display region D, openings Ahg and Ahs are formed in the first interlayer insulating film 15 and the second interlayer insulating film 17, which are closer to the organic EL element 30 than 14dg and 14ds, and are formed to extend through the first interlayer insulating film 15 and the second interlayer insulating film 17, thereby exposing the upper surfaces of the semiconductor layers 14dg and 14ds. As illustrated in FIGS. 14 and 15, a flattening film 19 is provided in the openings Ahg and Ahs so as to fill the openings Ahg and Ahs. Here, when the semiconductor layers 14dg and 14ds are made of, for example, a low-temperature polysilicon film, they are made electrically conductive by ion doping or the like and have electrical conductivity. When the semiconductor layers 14dg and 14ds are made of, for example, an oxide semiconductor film, they are made electrically conductive by hydrogen plasma treatment, helium plasma treatment, or the like, and have electrical conductivity. Furthermore, as illustrated in FIG. 14, a source line 18f is provided between the opening Ahs and the flattening film 19. Further, as illustrated in FIGS. 13 and 14, the semiconductor layer 14ds is provided so as to overlap each source line 18f, and each source line 18f and the semiconductor layer 14ds are electrically connected to each other through the opening Ahs, so that the wiring line resistance of each source line 18f can be reduced.

As with the organic EL display device 50a of the first embodiment, the organic EL display device 50c described above is flexible and, in each subpixel P, displays an image by causing a light-emitting layer 3 of the organic EL layer 23 to emit light appropriately through the first TFT 9a and the second TUFT 9b.

The organic EL display device 50c of the present embodiment, in the TFT layer forming step described in the first embodiment, can be manufactured by: not forming the conductive layer 12d when the gate lines 12 or the like are formed; forming the semiconductor layers 14c when the semiconductor layers 14a and 14h are formed; and forming the openings Ah instead of forming the openings Ag and As.

As described above, according to the organic EL display device 50c of the present embodiment, in the display region D, the semiconductor layer 14c is provided as an etching stopper layer between the gate insulating film 13 and the first interlayer insulating film 15. Then, in the first interlayer insulating film 15 and the second interlayer insulating film 17, which are closer to the organic EL element 30 than the semiconductor layer 14c, in the opening forming step, an opening Ah that extends through the first interlayer insulating film 15 and the second interlayer insulating film 17 to expose the upper surface of the semiconductor layer 14c is formed. Further, a flattening film 19 is provided in the opening Ah so as to fill the opening Ah in the flattening film forming step. Accordingly, since film breakage of the first interlayer insulating film 15 and the second interlayer insulating film 17 is suppressed when the organic EL display device 50c is bent in the display region D, damage to the organic EL element 30 due to bending in the display region D can be suppressed.

Further, according to the organic EL display device 50c and the method for manufacturing the same of the present embodiment, since the base coat film 11 is provided on the entire upper surface of the resin substrate layer 10, it is possible to prevent moisture or the like from entering the organic EL element 30 from the resin substrate layer 10.

Other Embodiments

In each of the above embodiments, the organic EL layer has a five layer laminated structure of the hole injection layer, the hole transport layer, the light-emitting layer, the electron transport layer, and the electron injection layer, but the organic EL layer may have a three layer laminated structure of, for example, the hole injection and hole transport layer, the light-emitting layer, and the electron transport and electron injection layer.

In addition, in each of the embodiments described above, the organic EL display device, in which the first electrode is the anode and the second electrode is the cathode, is exemplified, but the disclosure can also be applied to an organic EL display device in which the laminated structure of the organic EL layer is reversed, the first electrode is the cathode, and the second electrode is the anode.

Further, in each of the above embodiments, the organic EL display device including the element substrate, in which the electrode of the TFT connected to the first electrode is used as the drain electrode, is exemplified. However, the disclosure can also be applied to an organic EL display device including an element substrate in which the electrode of the TFT connected to the first electrode is referred to as the source electrode.

Although the organic EL display device has been described as an example of the display device in each of the above embodiments, the disclosure can be applied to a display device including a plurality of light-emitting elements driven by a current. For example, the disclosure can be applied to a display device including a quantum-dot light emitting diode (QLED) that is a light-emitting element using a quantum dot-containing layer.

INDUSTRIAL APPLICABILITY

As described above, the disclosure is useful for a flexible display device.

The invention claimed is:
1. A display device comprising:
a resin substrate;
a TFT layer provided on the resin substrate; and
a light-emitting element provided on the TFT layer and included in a display region,
wherein: the TFT layer includes
a plurality of inorganic insulating films provided on the resin substrate,
a plurality of first wiring lines provided between the plurality of inorganic insulating films and made of a plurality of metal films extending parallel to each other in a plan view of the display region,
a plurality of semiconductor layers provided between inorganic insulating films of the plurality of inorganic insulating films located closer to the light-emitting element than the plurality of first wiring lines, each of the plurality of semiconductor layers included in a TFT,
a plurality of second wiring lines provided on a light-emitting element side of an inorganic insulating film closest to the light-emitting element of the plurality of inorganic insulating films, and extending parallel to each other in a direction intersecting the plurality of first wiring lines in the display region, and
a flattening film provided closer to the light-emitting element than the plurality of second wiring lines;
in the display region, an etching stopper layer is provided between inorganic insulating films of the plurality of inorganic insulating films;
an opening is formed in inorganic insulating films located closer to the light-emitting element than the etching stopper layer, the opening extending through the inorganic insulating films and exposing an upper surface of the etching stopper layer;
the flattening film is provided in the opening such that the opening is filled with the flattening film;
the opening is formed along a first wiring line of the plurality of first wiring lines so as to overlap the first wiring line and not to overlap a second wiring line of the plurality of second wiring lines;
the etching stopper layer includes the first wiring line;
a metal layer formed of the same material as a material of the plurality of second wiring lines in the same layer as a layer of the plurality of second wiring lines is provided along an extending direction of the plurality of first wiring lines in an island shape between the opening and the flattening film and covers the etching stopper layer exposed from the opening and a peripheral end portion of the opening; and
the first wiring line and the metal layer are electrically connected to each other through the opening.
2. A display device comprising:
a resin substrate;
a TFT layer provided on the resin substrate; and
a light-emitting element provided on the TFT layer and included in a display region, wherein: the TFT layer includes
- a plurality of inorganic insulating films provided on the resin substrate,
- a plurality of first wiring lines provided between the plurality of inorganic insulating films and made of a plurality of metal films extending parallel to each other in a plan view of the display region,
- a plurality of semiconductor layers provided between inorganic insulating films of the plurality of inorganic insulating films located closer to the light-emitting element than the plurality of first wiring lines, each of the plurality of semiconductor layers included in a TFT,
- a plurality of second wiring lines provided on a light-emitting element side of an inorganic insulating film closest to the light-emitting element of the plurality of inorganic insulating films, and extending parallel to each other in a direction intersecting the plurality of first wiring lines in the display region, and
- a flattening film provided closer to the light-emitting element than the plurality of second wiring lines;

in the display region, an etching stopper layer is provided between inorganic insulating films of the plurality of inorganic insulating films;

an opening is formed in inorganic insulating films located closer to the light-emitting element than the etching stopper layer, the opening extending through the inorganic insulating films and exposing an upper surface of the etching stopper layer;

the flattening film is provided in the opening such that the opening is filled with the flattening film;

the opening is formed along a second wiring line of the plurality of second wiring lines so as to overlap the second wiring line and not to overlap a first wiring line of the plurality of first wiring lines;

the etching stopper layer includes a conductive layer formed of the same material as a material of the plurality of first wiring lines in the same layer as a layer of the plurality of first wiring lines, wherein the conductive layer is formed to extend along the second wiring line; and the second wiring line and the conductive layer are electrically connected to each other through the opening.

3. The display device according to claim 2,
wherein the etching stopper layer includes another semiconductor layer formed of the same material as a material of the plurality of semiconductor layers in the same layer as a layer of the plurality of semiconductor layers.

4. The display device according to claim 3,
wherein the another semiconductor layer has electrical conductivity and is provided to overlap the second wiring line of the plurality of second wiring lines, and
the second wiring line and the another semiconductor layer are electrically connected to each other through the opening.

5. The display device according to claim 1,
wherein the plurality of first wiring lines are a gate line, and
the plurality of second wiring lines are a source line.

6. The display device according to claim 1,
wherein the light-emitting element is an organic EL element.

7. The display device according to claim 2,
wherein the plurality of first wiring lines are a gate line, and
the plurality of second wiring lines are a source line.

8. The display device according to claim 2,
wherein the light-emitting element is an organic EL element.

* * * * *